(12) United States Patent
Chen et al.

(10) Patent No.: US 11,581,511 B2
(45) Date of Patent: Feb. 14, 2023

(54) DISPLAY PANEL AND DISPLAY DEVICE INCLUDING THE SAME

(71) Applicant: Everdisplay Optronics (Shanghai) Co., Ltd., Shanghai (CN)

(72) Inventors: Ting Chen, Shanghai (CN); Mei Chen, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 44 days.

(21) Appl. No.: 16/995,088

(22) Filed: Aug. 17, 2020

(65) Prior Publication Data
US 2021/0066657 A1  Mar. 4, 2021

(30) Foreign Application Priority Data

Aug. 30, 2019  (CN) .......................... 201910814019.2

(51) Int. Cl.
*H01L 51/52*  (2006.01)
*H01L 51/56*  (2006.01)
*H01L 27/32*  (2006.01)

(52) U.S. Cl.
CPC ...... *H01L 51/5253* (2013.01); *H01L 27/3244* (2013.01); *H01L 51/56* (2013.01)

(58) Field of Classification Search
CPC .................................................. H01L 51/5253
See application file for complete search history.

(56) References Cited

U.S. PATENT DOCUMENTS

2019/0245159 A1\* 8/2019 Kim .................... H01L 27/3244
2021/0234122 A1\* 7/2021 Choi ....................... H01L 51/56

\* cited by examiner

*Primary Examiner* — Caleb E Henry
(74) *Attorney, Agent, or Firm* — Qinghong Xu

(57) ABSTRACT

The present invention provides a display panel including a through-hole, a non-display area surrounding the through-hole and a display area; the non-display area includes a substrate, an organic film layer structure, an inorganic film layer structure and a light-emitting functional layer; the organic film layer structure includes a plurality of organic thin film layers; the inorganic film layer structure includes at least one annular first through-groove surrounding the through-hole; the organic film layer structure includes at least one annular second through-groove surrounding the through-hole; the first through-grooves correspond to the second through-grooves by way of one to one, respectively; the width of the first through-groove is smaller than the width of the second through-groove at the organic thin film layer that is in contact with the inorganic film layer structure in the organic film layer structure; the light-emitting functional layer is disconnected at the first through-grooves.

20 Claims, 7 Drawing Sheets

DISPLAY PANEL AND DISPLAY DEVICE INCLUDING THE SAME

CROSS-REFERENCE TO RELATED APPLICATIONS

This application is based upon and claims priority to Chinese Patent Application No. CN 201910814019.2, filed on Aug. 30, 2019, the entire contents of which are incorporated herein by reference.

TECHNICAL FIELD

The present invention relates to the field of display panels, and in particularly, to a display panel, a manufacturing method and a display device including the same.

BACKGROUND

With the development of society and the continuous advancement of science and technology, people have higher and higher demands on a display screen of the mobile phone. The display screen of the Mobile phone is getting bigger and bigger, and the bezels are getting narrower and narrower, Mobile phones that pursue a high screen-to-body ratio have become a mainstream trend in the world.

Full screens, Notch screens, water drop screens or beautiful sharp screens have appeared on the market. At the same time, through the technology of designing narrow bezels and hiding mobile phone handset and other devices that are made small into the bezels, the screen-to-body ratio of mobile phones can reach 90%. However, the front camera having the selfie function commonly used by users today cannot be replaced by other technologies. At present, one or more holes are generally punched at a region which corresponds to the front camera in the display panel. The screen-to-body ratio of a latest punch-hole screen can reach 91.8%.

In the organic display panel, a special encapsulation process is required at the through-holes of the screen to effectively block a light-emitting functional layer, thereby preventing the display panel from malfunctioning due to the penetration of water or oxygen from the outside into the organic light-emitting layer, and increasing the life of the display panel.

It should be noted that the information disclosed in the above background section is only used to enhance the understanding of the background of the present invention, and therefore may include information that does not constitute prior art known to those of ordinary skill in the art.

SUMMARY

An object of the present invention is to provide a display panel, a manufacturing method thereof, and a display device including the same. The display panel of the present invention disposes one or more through-grooves having an undercut structure in a non-display area surrounding one or more through-holes, so that a light-emitting functional layer and an organic film layer structure are discontinuous in a extending direction of the through-holes toward a display area, effectively blocking water and oxygen from diffusing towards the display area along the organic film layer.

An embodiment of the present invention provides a display panel, including: a through-hole, a non-display area surrounding the through-hole, and a display area; the non-display area comprises a substrate, an organic film layer structure, an inorganic film layer structure, and a light-emitting functional layer in sequence along a light exit direction;

the organic film layer structure comprises a plurality of organic thin film layers;

the inorganic film layer structure comprises at least one annular first through-groove surrounding the through-hole;

the organic film layer structure comprises at least one annular second through-groove surrounding the through-hole;

the first through-grooves correspond to the second through-grooves by way of one to one, respectively;

a width of each of the first through-grooves is smaller than a width of a corresponding second through-groove in the organic film layer structure at the organic thin film layer that is in contact with the inorganic film layer structure; and the light-emitting functional layer is disconnected at the first through-grooves.

Preferably, the inorganic film layer structure comprises 5 to 10 first through-grooves.

Preferably, the through-hole and the at least one annular first through-groove form a concentric circle structure.

Preferably, the width of each of the first through-grooves is between 10.0 um to 15.0 um.

Preferably, a distance between two adjacent ones of the first through-grooves is between 20.0 µm to 30.0 um.

Preferably, the display area comprises a substrate, a thin film array transistor layer, and a light-emitting device layer, and the light-emitting device layer comprises an anode layer, a light-emitting functional layer, and a cathode layer.

Preferably, the non-display area further comprises a thin film encapsulation structure disposed on the light-emitting functional layer, and the thin film encapsulation structure continuously covers the first through-grooves and the second through-grooves.

Preferably, the thin film encapsulation structure comprises at least two inorganic thin film layers which are stacked.

Preferably, the thin film encapsulation structure is obtained by adopting a plasma enhanced chemical vapor deposition method.

An embodiment of the present invention also provides a method for manufacturing a display panel, which is used to manufacture the above display panel, and is characterized by including the following steps:

providing a substrate;

forming a thin film transistor array and an anode layer in sequence in a display area of the substrate;

forming an organic film layer structure in a non-display area of the substrate, the organic film layer structure comprises a plurality of organic thin film layers, and the organic film layer structure is a positive photoresist or a negative photoresist;

patterning and exposing the organic film layer structure to form at least one subsequent developable annular structure;

forming a patterned inorganic film layer structure on the organic film layer structure, the inorganic film layer structure comprises at least one first through-groove having a shape of annular; positions of the first through-grooves and corresponding positions of the annular structures overlap respectively, and a width of each of the first through-grooves is smaller than a width of a corresponding one of the annular structures;

developing the annular structures; and forming a light-emitting functional layer on the inorganic film layer structure.

Preferably, the manufacturing method of the display panel further includes a step of forming a thin film encapsulation structure on the light-emitting functional layer.

An embodiment of the present invention also provides a display device including the above display panel.

The display panel of the present invention is provided with a through-hole capable of accommodating a component, such as a camera and so on. A plurality of through-grooves having the undercut structure that is provided surrounding the non-display area of the through-hole can cut off the extension of the light-emitting functional layer and organic film layer structure in the direction from the through-hole toward the display area, which can block water, oxygen and cracks at the through-hole from diffusing of along the organic layer to the display area, thereby reducing the failure of the display panel due to the invasion of water, oxygen or cracks at the through-hole and improving the life of display panel.

BRIEF DESCRIPTION OF THE DRAWINGS

The drawings herein are incorporated into and constitute a part of the specification. The drawings show embodiments consistent with the present application, and are used to explain the principles of the application together with the specification. By reading and referring to the following detailed description of the non-limiting embodiments made by the drawings, other features, objects and advantages of the present invention will become more obvious. Obviously, the drawings in the following description are only some embodiments of the present invention. For those of ordinary skill in the art, without paying any creative work, other drawings can be obtained based on these drawings.

REFERENCE NUMERALS

Figure 1:
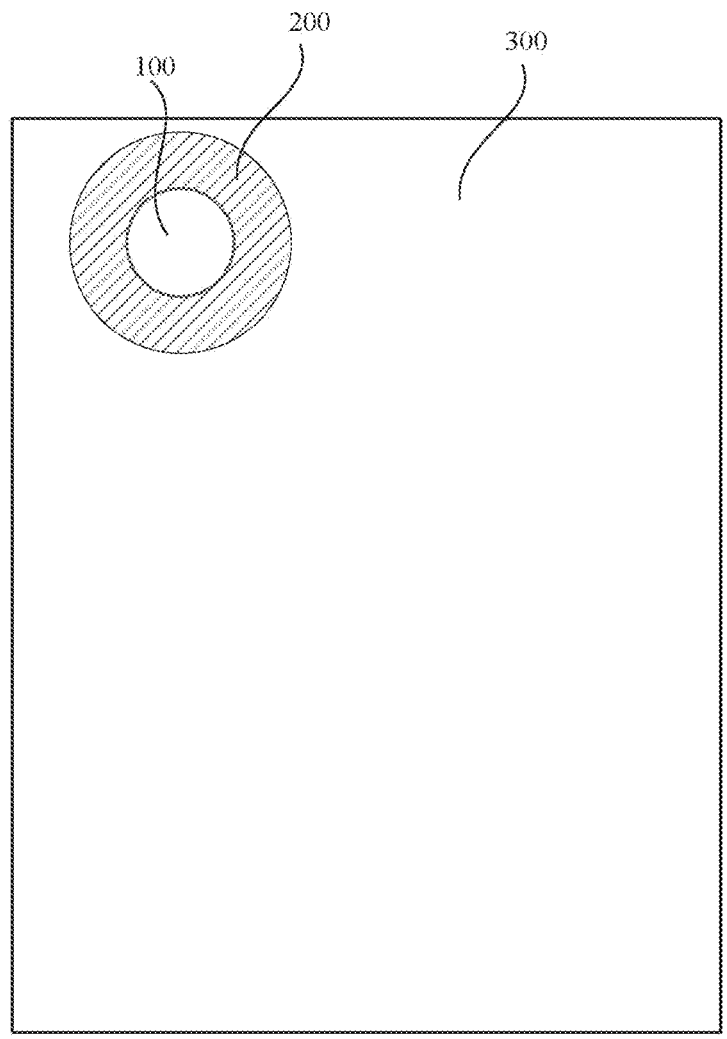
FIG. 1 is a schematic diagram of a display panel according to an embodiment of the invention.

100 Through-hole
200 Non-display area
201 First through-groove
202 Second through-groove
210 Substrate
220 Buffer layer
230 Organic film layer structure
240 Inorganic film layer structure
250 Light-emitting functional layer
260 Thin film encapsulation structure
300 Display area

DETAILED DESCRIPTION

Example embodiments will now be described more fully with reference to the drawings. However, the example embodiments can be implemented in various forms, and should not be construed as being limited to the examples set forth herein; on the contrary, providing these embodiments makes the disclosure more comprehensive and complete, and fully conveys the concept of the example embodiments to those skilled in the art. The described features, structures, or characteristics may be combined in one or more embodiments in any suitable manner.

In addition, the drawings are only schematic illustrations of the present disclosure and are not necessarily drawn to scale. The same reference numerals in the drawings denote the same or similar parts, and thus their repeated description will be omitted. Some of the block diagrams shown in the drawings are functional entities and do not necessarily have to correspond to physically or logically independent entities.

FIG. 1 is a schematic diagram of a display panel according to an embodiment of the invention, which includes: a through-hole 100, a non-display area 200 surrounding the through-hole 100 and a display area 300.

Figure 3:
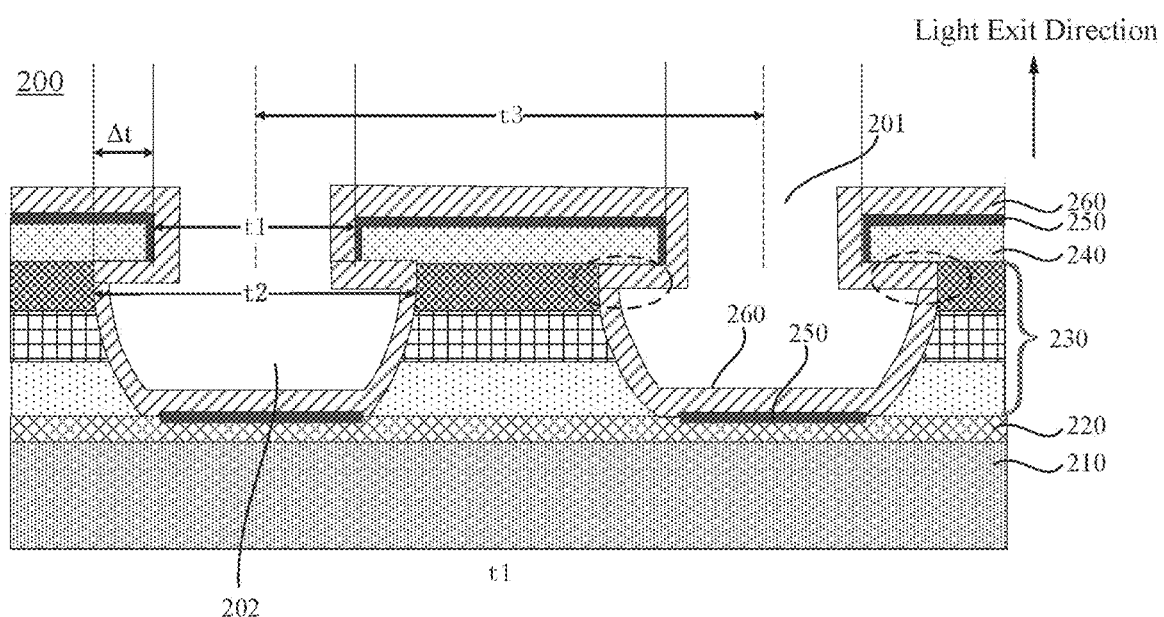
FIG. 3 is a cross-sectional view of the non-display area of the display panel along a A1A2 direction according to another embodiment of the present invention.

The non-display area 200 includes a substrate 210, an organic film layer structure 230, an inorganic film layer structure 240, and a light-emitting functional layer 250 in sequence along a light exit direction, which refers to a direction that light passing through the display panel or the non-display area 200. The light exit direction is generally a direction in which light exits the display panel perpendicularly. As shown in FIG. 3, it is from bottom to top.

The organic film layer structure 230 includes a plurality of organic thin film layers; preferably, the thickness of the organic film layer structure may be between 2.0 um to 4.0 um.

Figure 2:
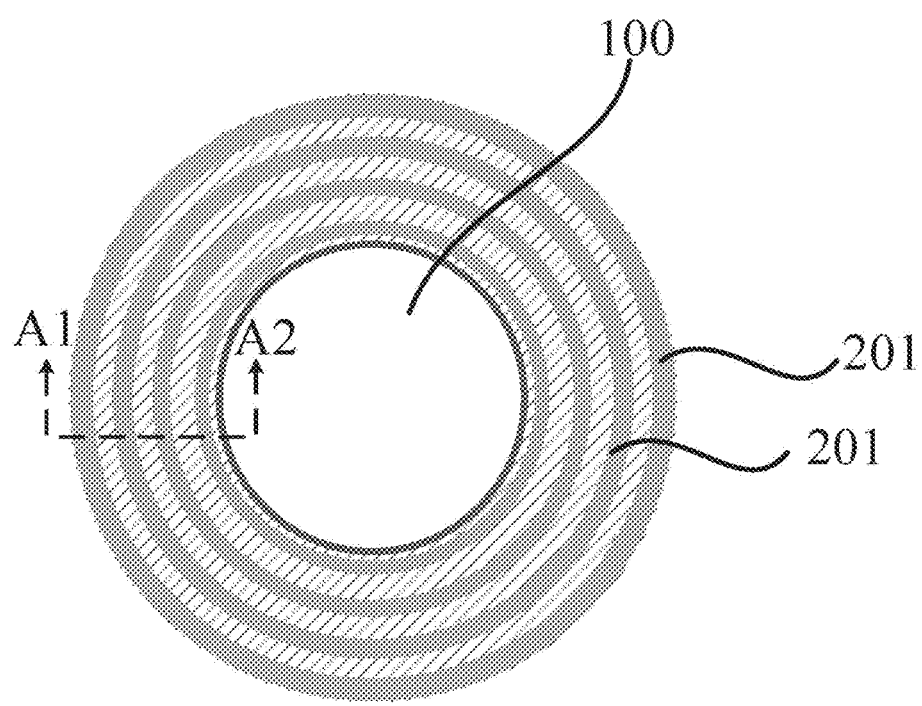
FIG. 2 is a structural diagram of a non-display area of a display panel according to an embodiment of the invention.

The inorganic film layer structure 240 includes at least one annular first through-groove 201 surrounding the through-hole 100, as shown in FIG. 2.

The through-hole 100 may be used to set an assembly of a display device, such as a camera, a sensor, or a speaker. The through-hole 100 may be circular, quadrilateral, or may have other shapes, which are not limited herein. FIG. 1 takes a commonly used circle as an example. Correspondingly, each of a plurality of first through-grooves 201 of the inorganic film layer structure may be a circular annular structure. Preferably, the inorganic film layer structure includes 5 to 10 first through-groove 201.

The plurality of first through-grooves 201 and the through-hole 100 may form a concentric circle structure, that is, the center of the through-hole 100 coincides with the centers of the plurality of first through-grooves 201, or the plurality of first through-grooves 201 may only be circular annular structure that surrounds the through-hole 100. If the through-hole is a quadrate, the first through-groove 201 may be a quadrate annular structure or a circular annular structure encircling the through-hole 100, The organic film layer structure 230 includes at least one annular second through-groove 202 surrounding the through-hole 100; the second through-grooves 202 makes the organic film layer structure at the non-display area 200 discontinuous.

There is a one-to-one correspondence between the first through-groove 201 and the second through-groove 202; FIG. 3 is a cross-sectional view of the non-display area of the display panel along the A1A2 direction according to another embodiment of the present invention. As shown in FIG. 3, the first through-groove 201 overlaps with the second through-groove 202, and the width of the first through-groove 201 is t1. In the embodiment of FIG. 3, the organic film layer structure 230 includes three organic thin film layers, and the width of the second through-groove at the organic thin film layer that is contact with the inorganic film layer structure 240 is t2. In the present invention, t1 is smaller than t2, that is, the first through-groove 201 and the second through-groove 202 overlap to form an undercut structure. At the undercut structure, the inorganic film layer structure 240 protrudes from the uppermost organic thin film layer in the organic film layer structure 230, the protruding width is Δt. In the embodiment, the value of Δt is between 1.01 um to 1.5 um.

The light-emitting functional layer of an organic light-emitting diode (OLED) is generally deposited by a thermal evaporation method. Since the first through-groove 201 and the second through-groove 202 overlap to form an undercut structure, in an embodiment of the present invention, the light-emitting functional layer is disconnected at the first through-groove, that is, the light-emitting functional layer 250 may be formed on the inorganic film layer structure 240 and the bottom of the undercut structure, but at oval dotted boxes in FIG. 3, the deposition of the light-emitting functional layer 250 cannot be implemented, so that at the undercut structure, the light-emitting functional layer 250 is disconnected, and the discontinuous light-emitting functional layer can effectively prevent the propagation of water and oxygen in this layer.

Preferably, the width t1 of the first through-groove 201 may be between 10.0 um to 15.0 um. In a display panel, the width of each of the first through-grooves 201 may be the same or different; the distance t3 between two adjacent ones of the first through-grooves 201 may be between 20.0 um to 30.0 um. Similarly, the distance between two adjacent ones of the first through-grooves 201 in a display panel may also be the same or different.

In an embodiment of the present invention, the non-display area 200 further includes a thin film encapsulation structure 260 disposed on the light-emitting functional layer 250. The thin film encapsulation structure 260 may be obtained by plasma enhanced chemical vapor deposition (PECVD). PECVD has the advantages of good film formation quality, etc. At the same time, PECVD uses microwaves or radio frequency, etc. to ionize the gas containing atoms of thin film composition, so as to form plasma locally. Therefore, one or more positions where film layers cannot be deposited by thermal evaporation method, like the oval dotted boxes shown in FIG. 3, the film layers can be deposited by PECVD. In the embodiment of the present invention, the thin film encapsulation structure 260 obtained by the PECVD method continuously covers the edge of the first through-groove and the second through-groove. At the undercut structure formed by the overlapping of the first through-groove 201 and the second through-groove 202, the thin film encapsulation structure 260 can be integrally formed, which effectively achieves the effect of lateral encapsulation.

In order to better play a role of water proof and oxygen proof, the thin film encapsulation structure 260 may include a plurality of inorganic thin film layers which are stacked, the material of the inorganic thin film layers may be inorganic materials such as silicon nitride, silicon oxide, silicon oxynitride, and the thickness of each of the plurality of inorganic thin film layers may be between 0.6 um to 1.6 um, With multiple encapsulation layers, the performance of each encapsulation layer can have a certain complementarity. Therefore, the inorganic thin film encapsulation structure has a high compactness and is mainly used to block the invasion of water and oxygen.

The non-display area of the present invention is a structure having a plurality of first through-grooves 201 and a plurality of second through-grooves 202, and can also play a buffering role and reduce the effect of cracks extending from the through-hole to the display area.

Figure 4:
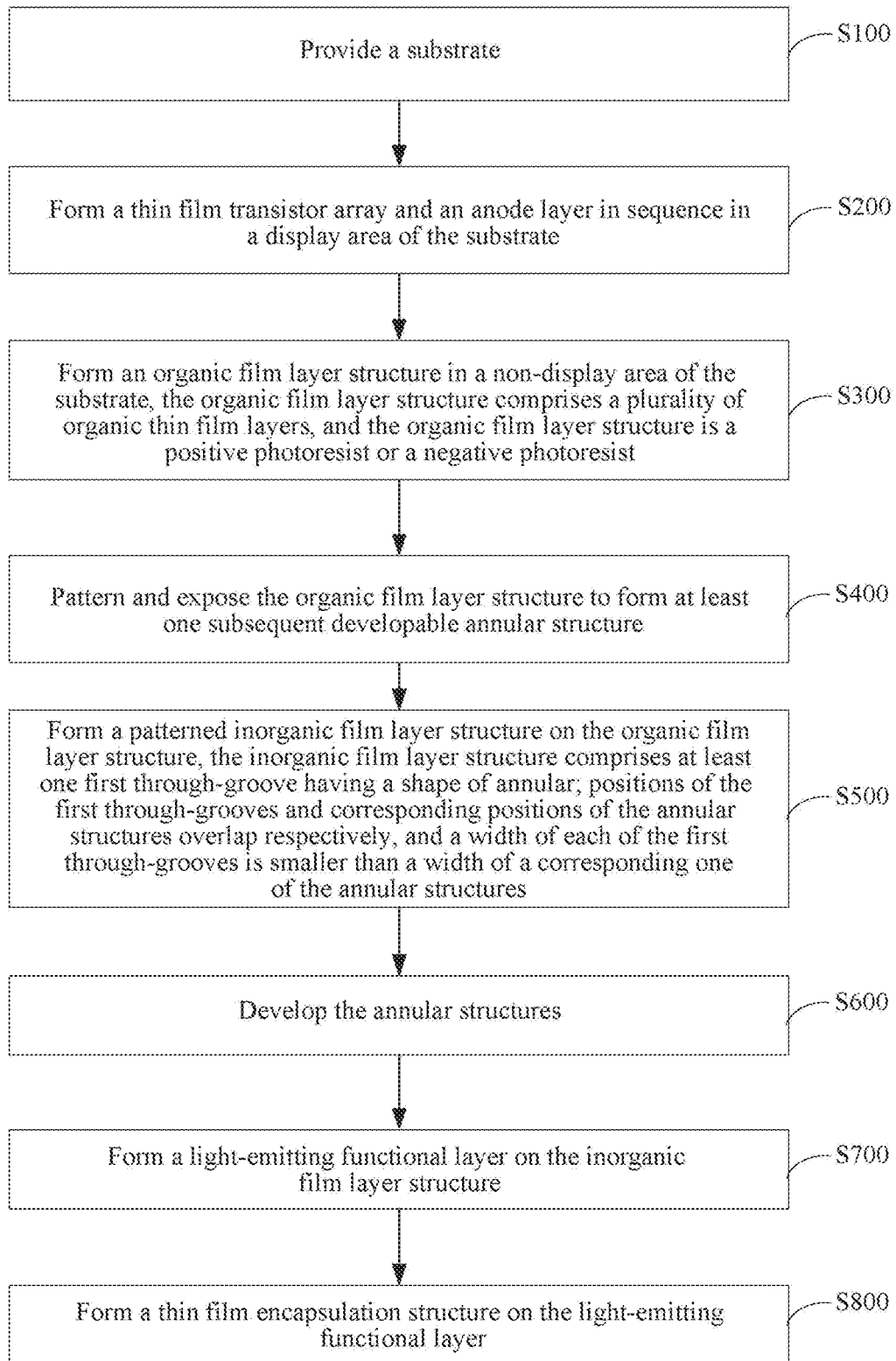
FIG. 4 is a flowchart of a method for manufacturing a display panel according to an embodiment of the invention.

An embodiment of the present invention also provides a method for manufacturing the above display panel. FIG. 4 is a flowchart of an embodiment of the present invention. For example, the method includes the following steps.

At a step S100, a substrate is provided;

At a step S200, a thin film transistor array and an anode layer are formed in sequence in a display area of the substrate;

In an embodiment of the present invention, the display area includes a substrate, a thin film array transistor layer, and a light-emitting device layer. The light-emitting device layer includes an anode layer, a light-emitting functional layer, and a cathode layer.

The substrate may be a rigid substrate or a flexible substrate, and the rigid substrate basically may be a glass substrate, etc. The flexible substrate may be a structure having a single-layer or multi-layer flexible substrate film, and the flexible substrate may use flexible substrate materials such as polyimide (PI), polyethylene terephthalate (PET), polybutylene naphthalate (PBN) or polycarbonate (PC) and may also use materials such as metal foil. In this embodiment, a single-layer PI film is used for the substrate. In other embodiments of the present invention, a buffer layer 220 may also be provided on the substrate. The buffer layer 220 may be one or more film layers composed of silicon nitride, silicon oxide, or silicon oxynitride, etc. The buffer layer 220 has a function of blocking water and oxygen penetrating from the substrate.

The thin film transistor array layer is located on one side of the substrate, and the thin film ransistor array layer includes a gate layer, a gate insulating layer, an active layer, a source layer, a drain layer, and the like.

A light-emitting device layer is located on a side of the thin film transistor array layer that is away from the substrate, the light-emitting device layer includes an anode layer, the light-emitting functional layer, and a cathode layer; the light-emitting functional layer may further include a transport layer provided between the anode layer and the cathode layer in a stack manner, the transport layer includes one or any combination of followings: an electron injection layer (EIL), an electron transport layer (ETL), a hole transport layer (HTL), a hole injection layer (HIL), and an insulating layer provided between the transport layer and the anode layer or between the transport layer and the cathode layer. The light-emitting functional layer of the present invention can be selectively designed according to the actual needs of each product for light-emitting brightness and light-emitting efficiency.

In practice, at the step S200, a plurality of functional layers, such as a planarization layer, a pixel definition layer, and so on, are sequentially formed in the display area, and the plurality of functional layers are formed before the manufacturing of the light-emitting functional layer.

At a step S300, an organic film layer structure is formed in a non-display area of the substrate, the organic film layer structure includes a plurality of organic thin film layers. In this step, the plurality of organic thin film layers may be selected from organic functional layers that are used in the manufacturing of the display area, that is, each of the plurality of organic thin film layer in the non-display area is manufactured at the same time when the organic functional layer in the display area is manufactured. However, it should be noted that each one of the organic thin film layers in the organic film layer structure needs to be a positive photoresist or a negative photoresist simultaneously.

At a step S400, the organic film layer structure is patterned and exposed to form at least one annular structure, which are developed later.

At a step S500, a patterned inorganic film layer structure is formed on the organic film layer structure, the inorganic film layer structure includes at least one first through-groove which has a shape of annular and the first through-grooves overlaps with the above annular structures, and the width of each of the first through-grooves is smaller than the width of each of the annular structures.

At a step S600, the annular structures are developed.

At a step S700, the light-emitting functional layer is formed on the inorganic film layer structure.

The manufacturing method of the above display panel may further include a step S800. The step S800 is a step of forming a thin film encapsulation structure on the light-emitting functional layer.

Figure 5:
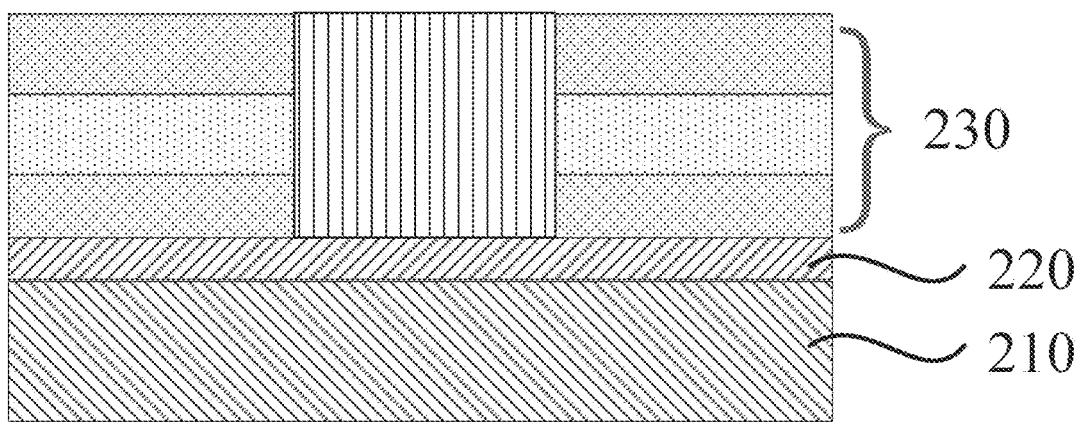
FIGS. 5 to 7 are schematic diagrams of steps S400, S500 and S600 of the method for manufacturing a display panel according to an embodiment of the present invention.
Figure 6:
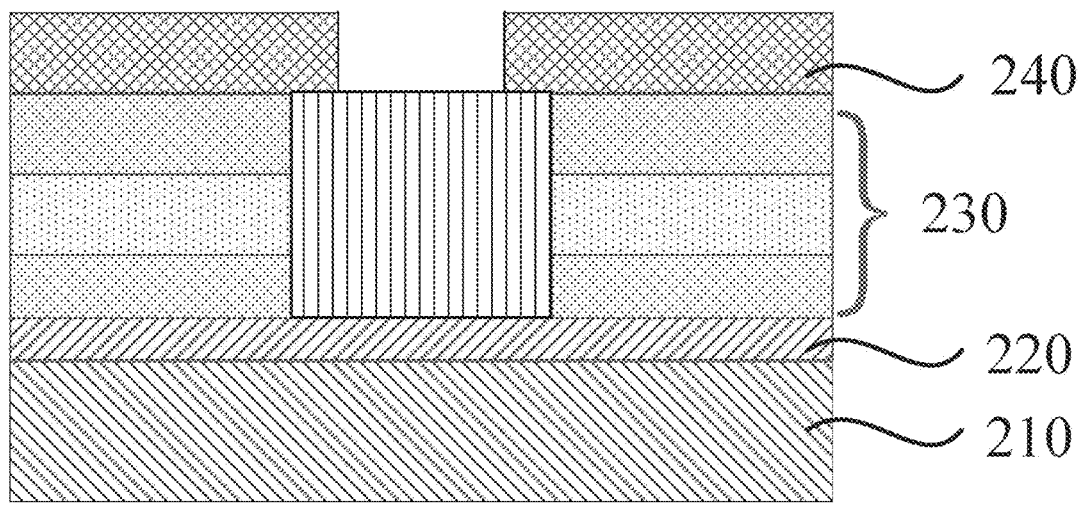
Figure 7:
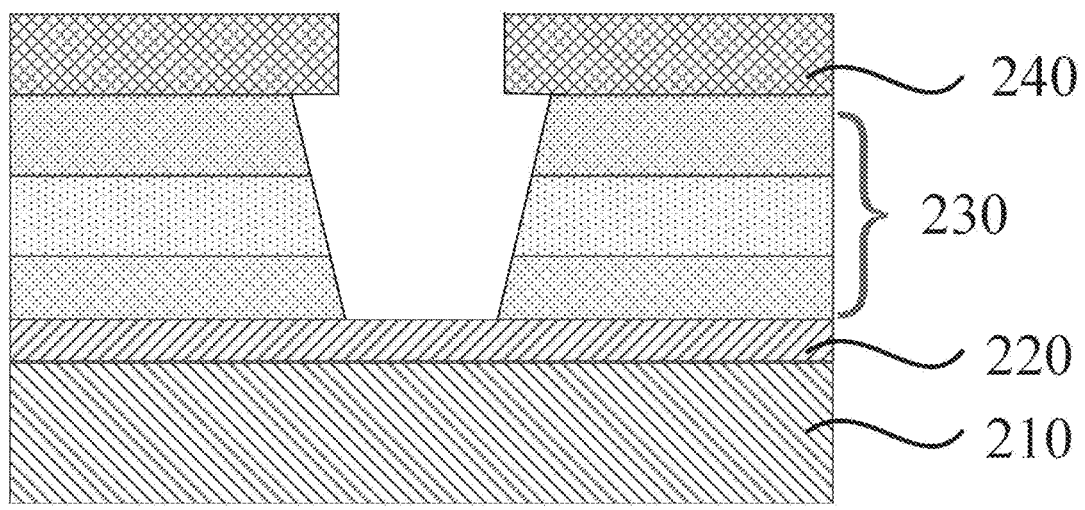

The following uses the organic film layer structure as a positive photoresist as an example to further illustrate the steps S400, S500 and S600 of the manufacturing method of the present invention, as shown in FIGS. 5 to 7, For example, in the step S400, the organic film layer structure 230 is patterned and exposed to form a plurality of exposed annular structures surrounding the through-hole, as shown at vertical stripes in FIG. 5.

Next, in the step S500, a patterned inorganic film layer structure 240 is formed on the organic film layer structure 230, the inorganic film layer structure 240 has a plurality of first through-grooves 201 which have a shape of annular, the plurality of first through-grooves 201 and the plurality of exposed annular structures are correspondingly stacked with each other, which means that the number of first through-grooves is the same as the number of exposed annular structures, and at the same time the width of the first through-grooves is smaller than the width of the exposed annular structures, as shown in FIG. 6.

After completing the above steps, in the S600, the exposed annular structures are developed, as shown in FIG. 7, and the first through-groove and the second through-groove are formed to form an undercut structure. It should be noted that, in FIGS. 5 to 7, only one first through-groove and one second through-groove are used as examples.

The difference between the manufacturing method of the organic film layer structure being negative photoresist and that of the organic film layer structure being positive photoresist lies in that, in the step S400, the organic film layer structure 230 is patterned and exposed, and the plurality of formed annular structure surrounding the through-hole are unexposed, and next the unexposed annular structure is developed in the step S600.

An embodiment of the present disclosure also provides a display device including the above display panel. In specific implementation, the display device provided by the embodiments of the present disclosure may be any product or component with a display function, such as a mobile phone, a tablet computer, a television, a display, a notebook computer, a digital photo frame, a media player, a watch device, a pendant device, an earphone or headphone device, a navigation device, a wearable or micro-device, an electronic device with a display installed in a self-service terminal, or an embedded device of a system in a car.

In summary, the display panel provided by the present invention is provided with a through-hole capable of accommodating a component, such as a camera and so on. A plurality of through-grooves having the undercut structure that is provided surrounding the non-display area of the through-hole can cut off the extension of the light-emitting functional layer and organic film layer structure in the direction along the through-hole toward the display area, which can block water, oxygen and cracks at the through-hole from diffusing of along the organic layer to the display area, thereby reducing the failure of the display panel due to the invasion of water, oxygen or cracks at the through-hole and improving the life of display panel.

The above is a further detailed description of the present invention in conjunction with specific preferred embodiments, and it cannot be assumed that the specific implementation of the present invention is limited to these descriptions. It is obvious to those skilled in the art that the present application is not limited to the details of the above exemplary embodiments, and that the present application can be implemented in other specific forms without departing from the spirit or basic characteristics of the present application. Therefore, no matter from which point of view, the embodiments should be regarded as exemplary and non-limiting, the scope of the present application is defined by the appended claims rather than the above description, and is therefore intended to include all changes fall within the meaning and scope of the equivalent requirements of claims into this application. Any reference signs in the claims should not be considered as limiting the claims involved. In addition, it is clear that the word "include" does not exclude other units or steps, and the singular does not exclude the plural. A plurality of units or devices stated in the apparatus claims can also be implemented by one unit or device through software or hardware. It should be understood that terms such as "down" or "upper", "downward" or "upward" are used to describe the features of the exemplary embodiments with reference to the positions shown in the figures; words such as first and second are used to indicate the name, but not to indicate any particular order.

What is claimed is:

1. A display panel, comprising: a through-hole, a non-display area surrounding the through-hole and a display area;
    the non-display area comprises a substrate, an organic film layer structure, an inorganic film layer structure, and a light-emitting functional layer in sequence along a light exit direction;
    the organic film layer structure comprises a plurality of organic thin film layers;
    the inorganic film layer structure comprises at least one annular first through-groove surrounding the through-hole;
    the organic film layer structure comprises at least one annular second through-groove surrounding the through-hole;
    the first through-grooves correspond to the second through-grooves by way of one to one, respectively;
    a width of each of the first through-grooves is smaller than a width of a corresponding second through-groove in the organic film layer structure at the organic thin film layer that is in contact with the inorganic film layer structure; and
    the light-emitting functional layer is disconnected at the first through-grooves.

2. The display panel according to claim 1, wherein the inorganic film layer structure comprises 5 to 10 first through-grooves.

3. The display panel according to claim 2, wherein the through-hole and the at least one annular first through-groove form a concentric circle structure.

4. The display panel according to claim 1, wherein the width of each of the first through-grooves is between 10.0 um to 15.0 um.

5. The display panel according to claim 1, wherein a distance between two adjacent ones of the first through-grooves is between 20.0 um to 30.0 um.

6. The display panel according to claim 1, wherein the display area comprises a substrate, a thin film array transistor layer, and a light-emitting device layer, and the light-emitting device layer comprises an anode layer, a light-emitting functional layer, and a cathode layer.

7. The display panel according to claim 1, wherein the non-display area further comprises a thin film encapsulation structure disposed on the light-emitting functional layer, and the thin film encapsulation structure continuously covers the first through-grooves and the second through-grooves.

8. The display panel according to claim 1, wherein the thin film encapsulation structure comprises at least two inorganic thin film layers which are stacked.

9. The display panel according to claim 1, wherein the thin film encapsulation structure is obtained by adopting a plasma enhanced chemical vapor deposition method.

10. A method for manufacturing a display panel, which is used to manufacture the display panel according to claim 1, comprising the following steps:
   providing a substrate;
   forming a thin film transistor array and an anode layer in sequence in a display area of the substrate;
   forming an organic film layer structure in a non-display area of the substrate, the organic film layer structure comprises a plurality of organic thin film layers, and the organic film layer structure is a positive photoresist or a negative photoresist;
   patterning and exposing the organic film layer structure to form at least one subsequent developable annular structure;
   forming a patterned inorganic film layer structure on the organic film layer structure, the inorganic film layer structure comprises at least one first through-groove having a shape of annular; positions of the first through-grooves and corresponding positions of the annular structures overlap respectively, and a width of each of the first through-grooves is smaller than a width of a corresponding one of the annular structures;
   developing the annular structures; and
   forming a light-emitting functional layer on the inorganic film layer structure.

11. The method for manufacturing a display panel according to claim 10, further comprising a step of forming a thin film encapsulation structure on the light-emitting functional layer.

12. A display device comprising a display panel, wherein the display panel comprises a through-hole, a non-display area surrounding the through-hole and a display area;
   the non-display area comprises a substrate, an organic film layer structure, an inorganic film layer structure, and a light-emitting functional layer in sequence along a light exit direction;
   the organic film layer structure comprises a plurality of organic thin film layers;
   the inorganic film layer structure comprises at least one annular first through-groove surrounding the through-hole;
   the organic film layer structure comprises at least one annular second through-groove surrounding the through-hole;
   the first through-grooves correspond to the second through-grooves by way of one to one, respectively;
   a width of each of the first through-grooves is smaller than a width of a corresponding second through-groove in the organic film layer structure at the organic thin film layer that is in contact with the inorganic film layer structure; and
   the light-emitting functional layer is disconnected at the first through-grooves.

13. The display device according to claim 12, wherein the inorganic film layer structure comprises 5 to 10 first through-grooves.

14. The display device according to claim 13, wherein the through-hole and the at least one annular first through-groove form a concentric circle structure.

15. The display device according to claim 12, wherein the width of each of the first through-grooves is between 10.0 um to 15.0 um.

16. The display device according to claim 12, wherein a distance between two adjacent ones of the first through-grooves is between 20.0 um to 30.0 um.

17. The display device according to claim 12, wherein the display area comprises a substrate, a thin film array transistor layer, and a light-emitting device layer, and the light-emitting device layer comprises an anode layer, a light-emitting functional layer, and a cathode layer.

18. The display device according to claim 12, wherein the non-display area further comprises a thin film encapsulation structure disposed on the light-emitting functional layer, and the thin film encapsulation structure continuously covers the first through-grooves and the second through-grooves.

19. The display device according to claim 12, wherein the thin film encapsulation structure comprises at least two inorganic thin film layers which are stacked.

20. The display device according to claim 12, wherein the thin film encapsulation structure is obtained by adopting a plasma enhanced chemical vapor deposition method.

* * * * *